United States Patent [19]
Pike-Biegunski

[11] Patent Number: 5,437,243
[45] Date of Patent: Aug. 1, 1995

[54] PROCESS FOR FABRICATING DIAMOND BY SUPERCRITICAL ELECTRICAL CURRENT

[76] Inventor: Maciej J. Pike-Biegunski, 28 W. 355 Rogers Ave., Warrenville, Ill. 60555

[21] Appl. No.: 909,087

[22] Filed: Jul. 1, 1992

[51] Int. Cl.⁶ .......................................... C30B 13/20
[52] U.S. Cl. ...................................... 117/49; 117/50; 423/446
[58] Field of Search ....... 156/603, DIG. 68, DIG. 73; 423/446; 117/49, 50

[56] References Cited

U.S. PATENT DOCUMENTS

| | | | |
|---|---|---|---|
| 3,207,582 | 9/1965 | Inoue | 423/446 |
| 4,563,341 | 1/1986 | Flynn | 423/446 |
| 4,836,881 | 6/1989 | Satoh et al. | 156/616.1 |
| 5,074,245 | 12/1991 | Ota et al. | 156/DIG. 68 |

Primary Examiner—R. Bruce Breneman
Assistant Examiner—FeLisa Garrett
Attorney, Agent, or Firm—James C. Nemmers

[57] ABSTRACT

Human-made diamond, as well as naturally found diamond, is a transparent, superhard, crystalline, and electrically nonconductive form of carbon. In this invention, an electrical current of supercritical density alone produces the transformation of graphite to diamond. The entire graphite-to-diamond transformation requires only a few millionths of a second. Using the principles of the invention, diamond can be produced in a variety of shapes, such as loose debris, rods, fibers, bars, dust, etc. In addition to diamond, Buckminster Fuller Balls, known also as C-60 carbon fullerines, are produced using the process and apparatus of the invention.

14 Claims, 3 Drawing Sheets

PROCESS FOR FABRICATING DIAMOND BY SUPERCRITICAL ELECTRICAL CURRENT

BACKGROUND OF THE INVENTION

Diamond is the hardest substance known to man. It is optically transparent, and electrically nonconductive. Therefore, diamond is a highly desirable and widely used material with both decorative and broad technological applications in a variety of industries. Industrial diamond uses include cutting, drilling, polishing of hard-to-work-with objects as well as geological drilling and cutting of ceramics, tungsten, carbides, etc. Other industrial uses are in the field of electronics, where diamond wafers utilize diamond's unique combination of electrical and thermal properties. It has been determined by crystallographers that the unique properties of diamond are because of the particular arrangement of carbon atoms within the diamond crystal. Such crystallographic structure is known as a "Cubic Face Centered", and is designated "A-4". Compared to other substances, diamond is relatively expensive.

On the other hand, graphite crystallizes in totally different systems known by crystallographers as either Hexagonal (designated "A-9"), or Rhomboedric (designated "D5,3"). Conversely to diamond, graphite is quite soft, is optically opaque, and conducts electricity. Graphite is produced in millions of tons annually in a variety of shapes from bars to fibers to powders. Diamond, conversely, is produced with great difficulty, and in a minuscule amount in comparison to graphite.

Historically, the first attempts to manufacture diamond for industrial use centered on reproducing natural geological conditions, which are believed to be the application of extreme pressures of layers of rocks and temperatures to graphite existing deep in the earth's crust. It is still believed that these conditions transformed graphite to diamond in the earth over geological periods of time. In any event, all existing industrial methods and processes of diamond making are technically complex, require highly sophisticated equipment, are cost intensive, and require a high level of academic knowledge.

Many currently used industrial diamond making processes utilize the principle of high energy delivered either by mechanical or chemical means. The majority of such methods are hazardous since they are conducted within massive, superstrong enclosures often placed in mine shafts. Typical high energy methods of diamond making are shown in Hall U.S. Pat. No. 2,947,608 and Iazu et al. U.S. Pat. No. 4,632,817.

There are a few other methods of diamond making such as the crystal growth from solution method disclosed in Custers et al. U.S. Pat. No. 3,124,422 and Satoh et al. U.S. Pat. No. 4,836,881. An electrical discharge method of diamond making is shown in Inoue U.S. Pat. No. 3,207,582. The epitaxial crystal growth diamond making method is illustrated in a number of U.S. patents including Fedoseev et al U.S. Pat. No. 4,104,441 and Kamo U.S. Pat. No. 4,989,542.

The laser beam application in diamond making can be seen in Ohsawa U.S. Pat. No. 5,066,515, and the low-pressure, partial vacuum, vapor phase synthesis and plasma deposition diamond making method is shown in Angus U.S. Pat. No. 3,607,061 and in Ota et al. U.S. Pat. No. 5,074,245.

The chemical methods of diamond making are typically shown in Eversole U.S. Pat. No. 3,030,187 and St. Pierre et al. U.S. Pat. No. 4,220,455.

The explosive diamond making method can be seen in DeCarli U.S. Pat. No. 3,238,019 and Shulzhenko et al. U.S. Pat. No. 3,676,068.

A diamond making process in which electrical current heating is applied is illustrated in Brayman U.S. Pat. No. 3,328,841 and Inuzuka et al U.S. Pat. No. 3,436,182.

The electrical discharge diamond making process is shown in Ktyoshi U.S. Pat. No. 3,207,582.

The mixed chemical-pressure-temperature diamond making process may be seen in a number of U.S. Patents, including Horton U.S. Pat. No. 3,597,158 and Masae Wakatsuki et al U.S. Pat. No. 3,436,183.

None of the prior art processes for making diamond provide a process which offers low capital investment and simplicity, is inexpensive and is capable of transforming graphite to diamond in a variety of shapes and forms such as powders, solid bars, fibers, ribbons, etc. The principal object, therefore, of this invention is to provide a new method of industrial diamond making that will overcome the deficiencies of the prior art processes.

SUMMARY OF THE INVENTION

This invention relates generally to a method or process and an apparatus for making industrial diamond by transforming graphite to diamond with the application of supercritical electrical current of a duration of microseconds. The allotropic transformation of graphite to diamond requires energy, and using the principles of the invention, energy is delivered to graphite exclusively in the form of an electrical current. In the preferred embodiment of the invention, a high voltage electrical current generator, which stores energy in a charged capacitor, is used. This high voltage generator provides a means of rapid discharge of an electrical current of supercritical densities. Such current is directed to flow through a graphite specimen to transform it to diamond. A critical current density is defined as resulting from an internal electrical field in graphite equal to one thousand volts per centimeter. Consequently, the supercritical current densities should be understood as resulting from the strength of an internal electrical field in graphite greater than one thousand volts per centimeter.

BRIEF DESCRIPTION OF THE DRAWINGS

The invention, together with its objects and the advantages thereof may be best understood by reference to the following description taken in conjunction with the accompanying drawings, in which like referenced numerals identify specific figures and elements and in which.

DETAILED DESCRIPTION OF THE PREFERRED EMBODIMENT

It was discovered in researching this invention, and furthermore is postulated theoretically, that the allotropic transformation of graphite to diamond occurs simultaneously under the supercritical current conditions by weakening the valent bonds in graphite crystals. This crystal bond weakening lasts a very short time. However, the heat and pressure associated with the supercritical current allow the allotropic transformation to diamond by valent electrons rearrangement while maintaining the original shape of the specimen. In the preferred embodiment of the invention, the commercially available opaque graphite fibers become light transparent diamond fibers.

Several restrictive conditions must exist in order to allow the process to take place. In the free space filled with gas such as air, the superhigh electrical charge delivered to the graphite specimen tends to flash over the graphite surface rather than to flow through the cross-section of the specimen. In order to utilize the invention to its full extent, one must therefore disallow the electrical charge flash over to happen. This may be achieved in several non-exclusive ways: first, by placing the graphite specimen such as a rod, compressed powder, or a bundle of graphite fibers tightly inside the ceramic reactor; second, by using vacuum lower than 0.1 millitorr inside the reactor filled with graphite; third, by filling the gap between the ceramic reactor and the graphite specimen with dielectric fluid; or fourth, by coating or covering the graphite specimen with the dielectric substance such as teflon or jacksting it in an epoxy-like film. It is important likewise that the electrical connection between the power supply and the reactor be short, and its design is guided by the rules of the high frequency circuit in which either the coaxial cable or a twisted pair of insulated wires is used. Note that the supercritical current phenomenon lasts a short time. A short time current event should comply with the high frequency circuit design principles.

Figure 1:
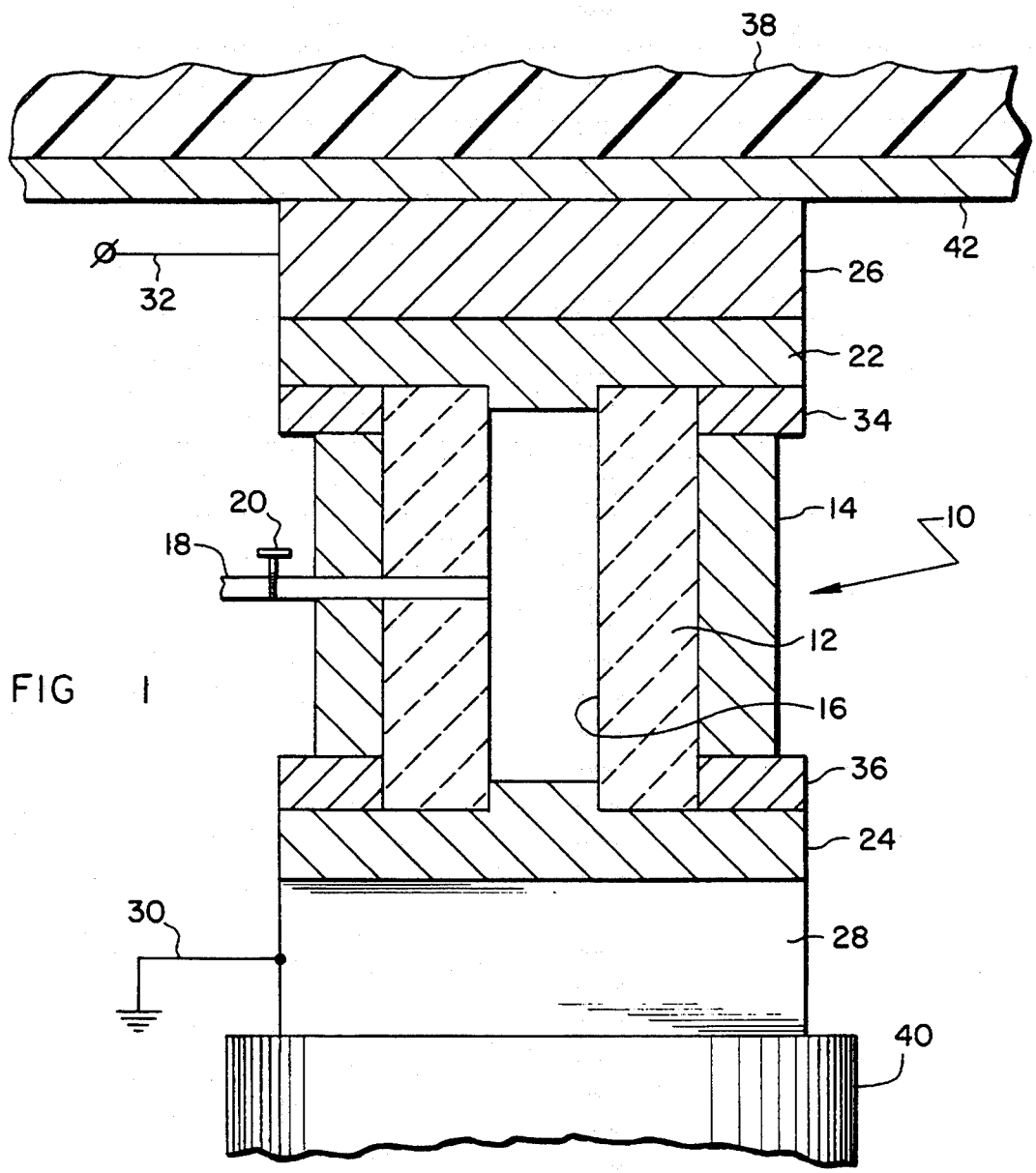
FIG. 1 is a view, partially in cross section, of the reactor used in carrying out the principles of the invention.

Referring now to the drawings, and first to FIG. 1, the cross section of a cylindrical reactor 10 is shown. The reactor 10 is used to house the graphite specimen that will be transformed into diamond. This specific design of the reactor 10 that is shown is by way of illustration, and it should be understood that other designs can be employed in carrying out the method of diamond making of the invention.

A highly compression-resistant ceramic tube 12, preferably made of 99.5% alumina, is brazed or otherwise attached inside a soft steel cylinder 14 that forms the outside surface of the reactor 10. The tube 12 provides a cylindrical chamber 16 into which a graphite element (not shown) is placed for conversion to diamond. A capillary tube 18 containing a valve 20 extends from chamber 16 through the tube 12 and cylinder 14, and tube 18 is connected to a standard vacuum pump (not shown) for the purpose of evacuating the chamber 16 of the reactor 10. The chamber 16 inside ceramic tube 12 is hermetically sealed by upper and lower platinum seals 22 and 24. Evacuation of chamber 16 to a pressure of 0.01 millitorr is recommended.

Figure 2:
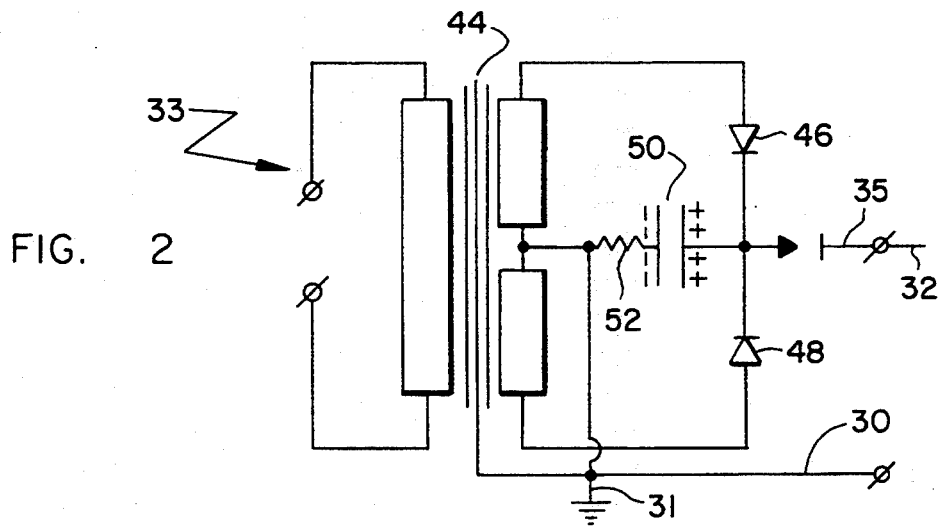
FIG. 2 is a schematic illustration of the high voltage power supply by which an electrical discharge of the capacitor delivers powerful electrical current pulse to carry out the principles of the invention.

The reactor 10 includes an upper steel plate 26 and a lower steel plate 28 that engage the upper and lower seals 22 and 24, respectively. Plate 28 is connected by means of a suitable electrical conductor 30 to the ground electrode 31 of a suitable power supply, indicated generally by the reference numeral 33 (FIG. 2). Plate 26 is electrically connected by conductor 32 to the high voltage electrode 35 of the power supply 33. The conductors 30 and 32 to the power supply 33 must be suitable for the high frequency electrical network of the power supply 33 which utilizes matched impedance. For example, the connections could be by coaxial cable or a twisted pair of insulated conductors.

Two electrical insulating gaskets 34 and 36 provide electrical insulation between the upper and the lower seals 22 and 24 and the metal cylinder 14. Consequently, all metallic parts in physical contact with seals 22 and 24 are insulated, thus allowing a high electrical potential difference to be maintained between the seals 22 and 24.

In order to apply pressure to seal the reactor 10, upper plate 26 is engaged by the upper jaw 38 of a standard hydraulic press (not shown) while lower plate 28 is engaged by the hydraulic actuator or piston 40 of the press. A hydraulic press with a 10 ton limit is suitable for a small laboratory reactor. The larger the reactor 10, the larger the press capacity needs to be to maintain a sufficiently strong hermetic seal between the components of the reactor 10 and the platinum seals 22 and 24. An insulating member 42 is preferable positioned between the jaw 38 and the upper plate 26 in order not to upset the previously described electrical conditions of the reactor 10. If the insulting member 42 were not present, an electrical short may occur via the hydraulic press, causing the reactor 10 to fail to operate under the conditions necessary to carry out the invention.

Referring now to FIG. 2, the high voltage power supply 33 is shown schematically. The primary side of a high voltage step-up transformer 44 is connected to a standard A.C. power supply providing an exemplary 110 volts of power. Transformer 44 will increase the voltage output on the secondary coils to a range of 10–20 kilovolts, and a pair of high voltage diodes 46 and 48 charge the high voltage capacitor 50. A high voltage spark gap 35 is built into the output of the power supply 33 in FIG. 2. A 100 microohm exemplary resistor 52 is used in serial connection with the capacitor 50 to monitor the current of the discharge. Typically, a current monitor such as the storage oscilloscope is connected to terminals 53 and 54 which determine the beginning and the end of the resistor 52. When the voltage on capacitor 50 reaches a predetermined air gap breakdown value, a sudden electrical current discharge occurs, and consequently a powerful current pulse flows to the reactor 10. The values of voltages and capacitances will depend upon the overall size of the reactor 10. Preferably, voltages should be no lower than 5 kilovolts and capacitances no smaller than 1 microfarad. The lower values are suitable for a reactor 10 used for demonstration purposes while the higher values will be required for reactors used for the industrial production of diamond. Voltage changes across the resistor 52 are monitored and are digitally stored and displayed by means of a high speed digitizing oscilloscope (not shown).

Figure 3:
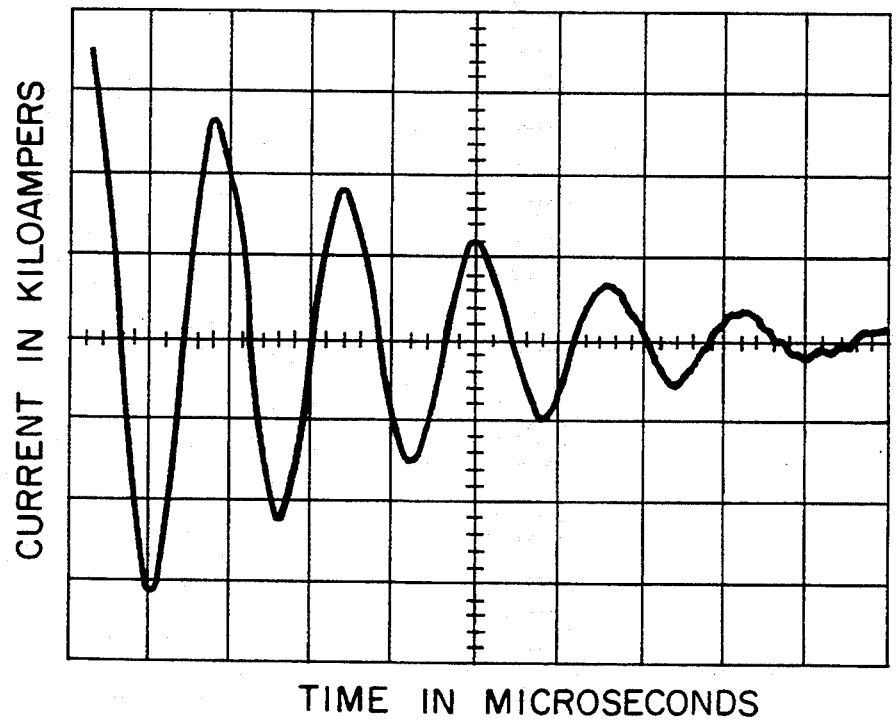
FIGS. 3 through 5 depict oscillograms of an electrical current for three possible and distinctively different conditions of the power supply discharge.
Figure 4:
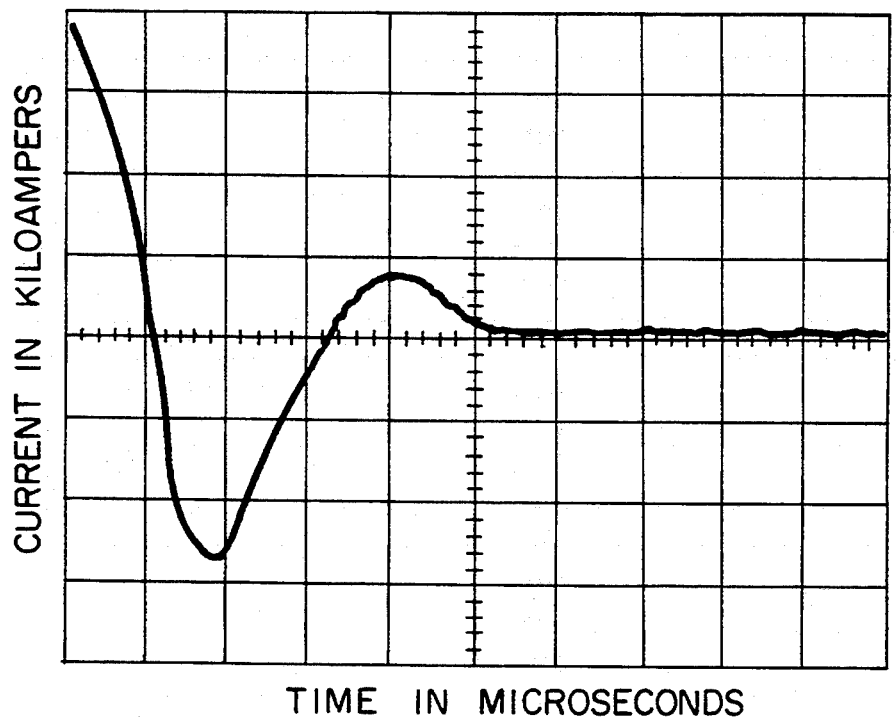
Figure 5:
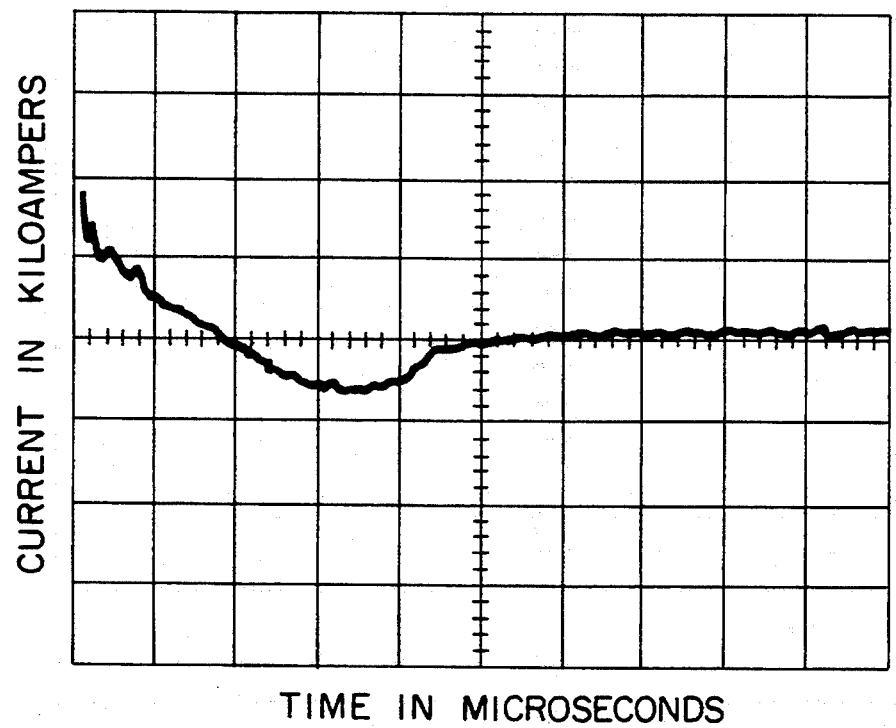

In order to demonstrate the principles of the invention, I have shown examples of characteristic voltages in the oscillograms of FIGS. 3, 4 and 5 for three possible situations in which an electrical discharge of the reactor 10 can occur. I have termed these as crowbar short, thin metallic wire short, and graphite specimen short. The first case exists when the output of the high voltage power supply 33 is shorted by a metallic crowbar. FIG.

3 illustrates an oscillogram of the electrical discharge current recorded by the digitizing storage oscilloscope for this case. The current of the discharge has a "ringing" character and lasts approximately 50 microseconds. The electrical current of the shape and duration shown in FIG. 3 will not produce diamond from a graphite specimen contained in the reactor 10.

The second case exists when the output of the high voltage power supply 33 is shorted by a suitable metallic wire exploding upon the electrical charge flow. For example, using a 2" long copper wire with a 0.010" diameter (5 cm and 0.25 mm respectively) to short the output of the power supply 33, the electrical discharge will last 5 microseconds. The oscillogram of FIG. 4 illustrates this case, and like the first case, the electrical current thus created will not produce diamond from a graphite specimen in the reactor 10.

FIG. 5 illustrates the oscillogram of an exemplary current discharge via a graphite specimen which is placed inside the reactor 10 and subjected to an electrical current according to the principles of the invention. Note that the electrical current oscillograms of FIG. 3 and 4 are quite different from the oscillogram of FIG. 5 for the supercritical current flow through the graphite specimen. The current flow preferably lasts only four microseconds, and during this short time interval, a total conversion of graphite to diamond occurs. It is believed that the allotropic transformation of graphite to diamond takes place by the supercritical current flow.

To carry out the transformation of graphite to diamond according to the principles of the invention, the reactor 10 is loaded by placing a suitable graphite specimen inside the chamber 16 of the ceramic tube 12 and then the chamber 16 is sealed by applying pressure using the hydraulic press. The air from chamber 16 is then evacuated through tube 18. Upon evacuation to the desired pressure, the valve 20 is closed. As an alternative to evacuating chamber 16, the chamber 16 of the reactor 10 may be filled with a common dielectric fluid of high purity, such as glycerol, silicon oil, or synthetic petroleum oil. Furthermore, no vacuum or dielectric fluid need be used if certain precautions are taken. In such a case, the graphite specimen must fit tightly inside chamber 16 of the ceramic tube 12 between the platinum seals 22 and 24 leaving less than 1% of the total volume of chamber 16 for air. As a further alternative, the surface of the graphite specimen either may be coated with a dielectric substance (such as thermosetting or U.V. curable resin) or placed inside a dielectric secondary enclosure (not shown), thereby tightly surrounding the graphite specimen with an electrical insulator. Regardless of the particular alternative used to insulate the graphite specimen, the transformation of graphite to diamond will occur upon supercritical current flow if the steps of the invention are properly carried out. Conversely, however, if the electrical flash over the graphite specimen surface is permitted by not properly following the above recommended alternatives, the graphite specimen will be pulverized and diamond will not be produced.

It is believed that the application of the supercritical current to the graphite specimen results in loosening the valent bonds in the graphite, thus creating the plausible conditions to allow phase transformation from graphite to diamond and to carbon fullerines C-60. The invention provides a simple process based on passing a single large electrical charge through graphite. Because the method and apparatus is strictly electrical, a process employing the principles of the invention can be precisely monitored electrically and precisely tuned to yield optimum manufacturing conditions. The process of the invention therefore eliminates the large variability and difficulty of setting process parameters so common for mechanical or chemical methods of diamond making. The process of the invention thus yields diamond of the highest possible purity, yielding complex carbon conglomerates containing 60 atoms of carbon and called either "Buckminster Fullerines" or "Bucky Balls". The process of the invention also is economical to perform since it permits fast reloading of the reactor chamber with graphite, while providing the flexibility of diamond making in a single shot or in a repetitive fabrication.

Although the invention has been described in connection with certain preferred embodiments, these are to be considered in all respects as illustrative and not restrictive, and the invention is not to be limited to the details disclosed. For example, the invention has been described as applied to the allotropic tansformation of graphite to diamond. However, it will be understood that the principles of the invention can be applied to produce allotropic transformation of any electrically conductive matter or substance, such as metals or alloys, having exemplary elements such as carbon, beryllium, cerium, tin, zirconium, cobalt, lanthanum, lithium, manganese, nickel, polonium, praeozdymium, rhodium, selenium, thallium, uranium, calcium, iron and tungsten. For example, tin exists both in the form of white tin or grey tin, and the invention can be used to convert the tin from white to grey without changing the shape. The proper application of the principles of the invention will produce a change only in the existing crystalline structure of the conductive substance. It will also be understood that this invention may be embodied in other specific forms, and that various revisions and modifications can be made to the preferred embodiments by persons skilled in the art without departing from the spirit of and scope of the invention. It is my intention, however, that all such revisions and modifications that are obvious to those skilled in the art will be included within the scope of the following claims.

What is claimed is as follows:

1. A method of producing allotropic transformation of graphite to diamond, said method comprising the steps of: providing a specimen of a selected shape and of the substance to be transformed; physically confining the specimen with electrically insulating high-strength material so that the specimen will hold its shape under pressure; applying pressure to the specimen between electrodes of a refractory material; applying to the specimen through the electrodes a pulse of an electrical current of super critical density and extremely short duration; and causing said current to flow through the entire specimen to produce an internal electrical field inside the entire specimen for a duration of only a few micro seconds during which the allotropic transformation of the entire specimen takes place without changing the original shape of the specimen.

2. The method of claim 1 including the step of preventing electrical charge flash over the specimen when the electrical current is applied to the specimen.

3. The method of claim 2 in which the specimen is confined within a sealed dielectric chamber.

4. The method of claim 3 in which preventing electrical charge flash over of the specimen is accomplished by producing a vacuum in the chamber containing the specimen.

5. The method of claim 3 in which preventing electrical charge flash over of the specimen is accomplished by filling the chamber containing the specimen with dielectric fluid.

6. The method of claim 2 in which the preventing of the electrical charge flash over of the specimen is accomplished by coating the specimen with a dielectric substance.

7. The method of claim 1 in which the electrically conductive substance is graphite, and the allotropic transformation is from graphite to diamond.

8. The method of claim 1 in which the application of the electrical current of supercritical density produces an internal electrical field in the graphite specimen that is at least 1000 volts per centimeter.

9. The method of claim 8 in which there is included the step of preventing electrical charge flash over the graphite specimen by providing a dielectric substance surrounding the specimen.

10. The method of claim 9 in which the electrical charge applied to the graphite specimen is a minimum of 1,000,000 coulombs per square centimeter of the cross section of the graphite specimen.

11. The method of claim 9 in which the specimen is confined within a sealed dielectric chamber.

12. The method of claim 11 in which preventing electrical charge flash over of the specimen is accomplished by producing a vacuum in the chamber containing the specimen.

13. The method of claim 11 in which preventing electrical charge flash over of the specimen is accomplished by filling the chamber containing the specimen with dielectric fluid.

14. The method of claim 11 in which the preventing of the electrical charge flash over of the specimen is accomplished by coating the specimen with a dielectric substance.

* * * * *